FREQUENCY MODULATION OF CRYSTAL OSCILLATOR

Filed Nov. 18, 1952

INVENTORS,
JEROME E. JACOBS,
ERCELL E. ST. JOHN,
BY Nicholas T Volsk
ATTORNEY.

2,747,164
Patented May 22, 1956

2,747,164

FREQUENCY MODULATION OF CRYSTAL OSCILLATOR

Jerome E. Jacobs, Culver City, and Ercell Edd St. John, Hawthorne, Calif., assignors, by mesne assignments, to Hughes Aircraft Company, a corporation of Delaware Application November 18, 1952, Serial No. 321,222

2 Claims. (Cl. 332—26)

This invention generally relates to oscillation generators, and more particularly to means for varying the frequency of the wave developed by a crystal-controlled oscillator.

As is well known, crystal-controlled oscillators of the prior art are employed in many circuit applications where stability of operation is required that is unattainable with conventional oscillators employing frequency selective feedback circuits; this is particularly true where it is desired to employ sine wave generators. On the other hand, where an oscillator is required that is capable of being tuned over a desired frequency range, the crystal-controlled oscillator of the prior art is not usable because the oscillator crystal is sharply resonant at one particular frequency and permits oscillations only at that frequency. However, a need is recognized for an oscillator developing an output wave of controllable frequency and having a stability approaching that of a crystal-controlled oscillator throughout a desired frequency range.

It is well known that the frequency of the output wave of a crystal oscillator can be controlled to the extent of a few parts per million (Radio Engineers Handbook, Terman, sec. 6, par. 4, pp. 448–497, McGraw-Hill Book Company, Inc., 1943). In accordance with the present invention, however, there is provided means for controlling the frequency of a crystal oscillator output wave to the extent of a few hundred parts per million. For example, the input circuit of the well known Pierce crystal oscillator is modified in accordance with the present invention to permit the application thereto to variable direct-current control voltages which effect the desired frequency variation of the oscillator output wave.

It is, therefore, an object of this invention to provide means for selectively varying the frequency of a crystal oscillator output wave.

It is another object of this invention to provide means for controlling the frequency of the output wave of a crystal-controlled oscillator to the extent of a few hundred parts per million.

It is still a further object of this invention to provide means for varying the grid bias of a modified Pierce crystal oscillator for controlling its frequency of operation.

The novel features which are believed to be characteristic of the invention, both as to its organization and method of operation, together with further objects and advantages thereof, will be better understood from the following description considered in connection with the accompanying drawing made a part of this specification. The scope of the invention is pointed out in the appended claims. In the drawing:

Figure 1:
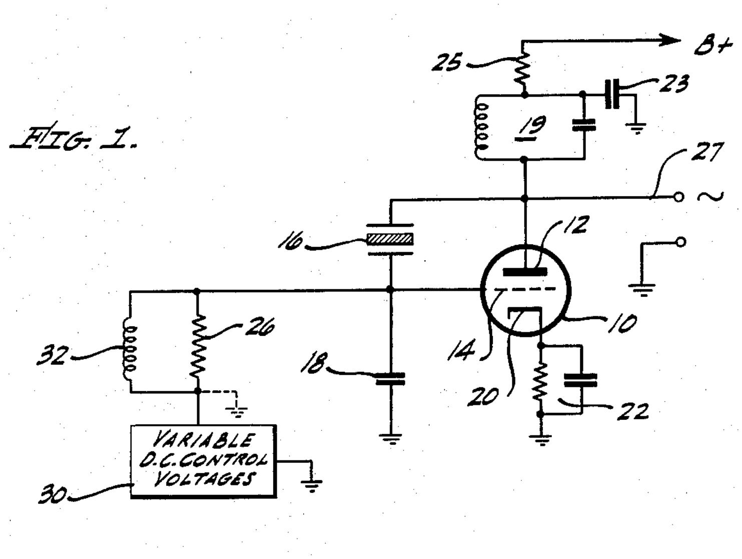
Fig. 1 is a schematic circuit diagram of a modified Pierce crystal-controlled oscillator adapted to be frequency modulated in accordance with this invention.

Referring to Fig. 1, a Pierce crystal-controlled oscillator modified in accordance with this invention comprises an electron discharge device or tube such as a triode 10 having its anode or plate 12 and control grid 14 coupled together by a piezoelectric crystal 16 that has a selected resonant frequency. A capacitor 18 is connected between the control grid 14 and a point of reference potential such as ground, whereby the grid circuit, looking from the control grid 14, appears capacitive. The anode circuit is loaded capacitively by means of a parallel-resonant LC (inductor-capacitor) circuit 19 which has a parallel-resonant frequency that is lower than the resonant frequency of the crystal 16. A conventional self-biasing network for the grid-cathode circuit is provided by an RC (resistor-capacitor) circuit 22 connected between the cathode 20 and ground. Anode voltage for the tube 10 is provided by coupling LC circuit 19 to the positive terminal B+ of a suitable direct-current voltage source. LC circuit 19 is by-passed to ground by capacitor 23 as shown. An anode resistor 25 is shown connected between LC circuit 19 and B+; this resistor improves the operation of the modified Pierce oscillator of this invention, and its function will be explained hereinafter.

As is well known, the conventional Pierce oscillator as above described is substantially the same as the Colpitts oscillator having the inductor of its frequency selective feedback circuit replaced by a piezoelectric crystal (crystal 16) and the plate-cathode resistor of its frequency selective circuit replaced by a parallel-resonant circuit (LC circuit 19) capacitively coupled to ground (capacitor 23). Furthermore, grid resistor 26 is grounded (shown in dotted lines) in the conventional Pierce oscillator to provide additional fixed control grid bias. The crystal 16, LC circuit 19 and capacitor 18 thus constitute the frequency selective circuit and provide the values of inductance and capacitance necessary to establish sinusoidal oscillations at a desired frequency and an output lead 27 connected to anode 12 provides means between anode 12 and ground for obtaining the output sine wave.

In accordance with present invention, the conventional Pierce oscillator is modified by connecting grid resistor 26 to one pole of a variable direct-current (D. C.) voltage source 30, the other pole of which may be grounded, as shown, thus providing means for varying the bias applied to the control grid 14. Grid resistor 26 is shunted by an inductor 32 to provide a low impedance path for the D. C. control voltages and a high impedance path for high-frequency oscillatory voltages between the source 30 and the control grid 14.

It has been found that by varying the grid bias of a modified Pierce crystal-controlled oscillator in the manner above described, the frequency of oscillations will increase as the grid bias becomes more positive and will decrease as the grid bias becomes more negative with respect to the control grid bias provided in the absence of D. C. control voltages from D. C. source 30. The variation of the frequency of the oscillatory wave as the grid bias changes is opposite to that which would be expected by virtue of the well-known Miller effect,, which explains decrease in frequency with increase of grid bias, and vice versa, on the basis of the fact that the grid-cathode capacitance increases and decreases, respectively, with increasing and decreasing grid bias to effectively add or subtract capacitance to the frequency selective circuit and thus lower or raise the resonant frequency thereof.

Figures 2, 3:
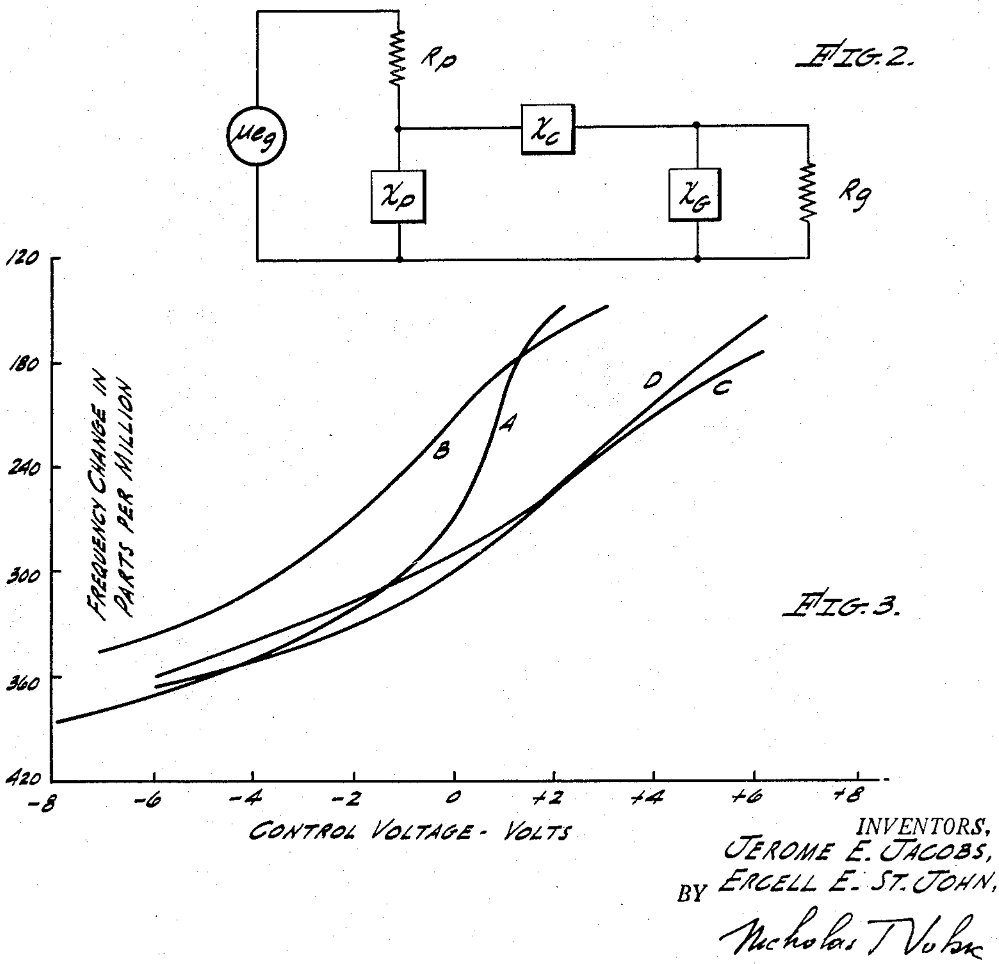
Fig. 2 is an equivalent circuit diagram of the oscillator shown in Fig. 1.
Fig. 3 is a graph illustrating the frequency variation plotted as a function of control voltage as obtained with the circuit of Fig. 1 under a variety of conditions.

The equivalent circuit of the above-described oscillator which is shown in Fig. 2, may be analyzed for the purpose of explaining the action of the oscillator of this invention in response to variations in grid bias.

For the equivalent circuit of Fig. 2, $X_C$ is the reactance of the crystal 16, which is inductive and positive, $X_G$ is the reactance of the grid circuit, which is capacitive and negative, $X_P$ is the reactance of the plate circuit, which is capacitive and negative, $R_P$ is the average internal plate resistance, $R_g$ is the average internal grid resistance plus external grid loading, $\mu$ is the amplification factor of the tube 10, and $e_g$ is the grid voltage.

Hence, $X_P$ and $X_C$ are of opposite sign, and preferably have absolute values of reactance such that $|X_C|>|X_P|$.

Analysis of the equivalent circuit of Fig. 2 shows that, for the usual circuit loop gain of unity necessary for sustained oscillations, a complex equation containing real and imaginary terms is obtained. By equating the real and imaginary terms to unity and zero, respectively, the following equations are obtained:

$$R_pR_g=\frac{X_PX_GX_C}{X_P+X_G+X_C} \qquad (1)$$

and $$\frac{R_p}{R_g}=-\frac{X_P}{X_P+X_C}\left(\mu+\frac{X_G+X_C}{X_G}\right) \qquad (2)$$

From a study of Equation 2, since $$\frac{R_p}{R_g}$$

must be a positive and real quantity, and $$-\frac{X_p}{X_P+X_C}$$

is positive, $$\mu>\left|\frac{X_G+X_C}{X_G}\right|$$

Furthermore, it can be shown that $X_G$ and $X_P$ are both negative and that $|X_G|>|X_P|$. Accordingly, since the product $R_PR_g$ (Equation 1) is always positive, $$|X_P+X_G|<|X_C|$$

and $$0<(X_P+X_G+X_C)<\epsilon$$

where $\epsilon$ is a positive quantity.

It has been found that, $(X_P+X_G+X_C)\rightarrow 0$ upon lowering of the grid control voltage and that the oscillator frequency approaches a lower limit, which of course is determined by the circuit tuning and the Q of the crystal. It has also been found that, in accordance with Equation 1, decreasing $R_P$ and/or $R_g$ by increasing the grid control voltage, $(X_P+X_G+X_C)$ increases as the grid control voltage is increased and that the frequency of the oscillatory wave increases to an upper limit, when tube 10 saturates. Thus, the frequency modulation range of the oscillator lies somewhere between these two limits.

Variation in frequency of the oscillator, as previously described, is illustrated by the curves of Fig. 3, which show the frequency change in parts per million below a reference frequency of 300 kc. (kilocycles) for various grid control voltages, to illustrate the transfer characteristics of the oscillator of this invention under a variety of conditions. Following is a description of these conditions:

Curve A represents what may be termed the transfer characteristic for the above-described oscillator as it is frequency modulated in accordance with this invention, where inductor 32 is omitted, the resistance of the grid resistor 26 is 22,000 ohms, and the value of the resistor in the RC bias network 22 is 330 ohms. As shown by curve A, the slope of the transfer characteristic under these conditions varies quite rapidly over a relatively short range of positive grid control voltages.

Curve B represents the transfer characteristic where the inductor 32 is connected across the grid resistor 26 and has the inductance value of 10 mh. (millihenry), the value of the grid resistor 26 is 33,000 ohms, and the value of the RC bias resistor is 330 ohms. Curve B has a more linear slope than curve A, and control of the frequency of the oscillator extends somewhat further to positive values of the grid bias voltage.

Curve C represents the transfer characteristic where the values of the coil 32 and grid resistor 26 described in connection with curve B are the same, but the value of the RC bias resistor is 680 ohms. As can be seen clearly from curve C, the frequency-modulation range under these conditions extends considerably further to higher positive values of the grid bias voltage than is possible under the conditions represented by curves A and B; furthermore, the linearity of the transfer characteristic is considerably improved.

Curve D represents the transfer characteristic for the conditions outlined above in connection with curve C, and with the addition of anode resistor 25, having a resistance of 2,500 ohms in the anode circuit of the tube 10. Curve D shows that the frequency-modulation range extends quite linearly over a relatively wide range of both negative and positive grid control voltages. Furthermore, the frequency changes over a wider range than is possible under the conditions described in connection with curves A, B, and C. Preferred values of the circuit parameters are, of course, those which would provide a transfer characteristic as illustrated by curve D.

In connection with the grid resistor 26 and the coil 32, it should be pointed out that a single resistive coil could be employed for providing the desired DC and AC paths previously mentioned, and of a suitable resistance and inductance value to insure the operation of the oscillator with a transfer characteristic such as curve D.

From the foregoing explanation, it is clear that a novel circuit has been provided for controlling the frequency of operation of a Pierce crystal oscillator over a substantial range as a function of varying grid bias control voltages so that the frequency of oscillations increases with increase in grid control voltages and decreases with decrease in grid control voltages.

What is claimed as new is:

1. A circuit arrangement for controlling the frequency of operation of a crystal-controlled oscillator to the extent of a few hundred parts per million, wherein said said oscillator employs an electron discharge device having at least an anode, a cathode, and a control grid, and a frequency-selective network for determining the frequency of the oscillatory wave to be generated by said oscillator including a piezoelectric crystal connected between said anode and said control grid, a capacitor connected between said control grid and a point of reference potential, and a parallel inductor-capacitor network resonant at a frequency below the resonant frequency of said crystal and connected to said anode and bypassed to a point of reference potential, said circuit arrangement comprising, in combination, a source of varying direct-current voltages, a first resistor connected between said control grid and one terminal of said varying voltage source, the other terminal of said varying voltage source being connected to said point of reference potential, an inductor element connected in shunt with said first resistor and operable therewith to provide a high impedance path to high-frequency oscillatory waves and a low impedance path for direct-current voltages, a grid bias network including a second resistor and a capacitor connected between said cathode and said point of reference potential, said second resistor having a resistance which is low compared to that of said first resistor, a source of constant direct-current voltage, and a third resistor connected between said parallel inductor-capacitor network and the positive terminal of said source and having a resistance intermediate that of said first and second resistors.

2. A circuit arrangement for controlling the frequency of operation of a crystal-controlled oscillator to the extent of a few hundred parts per million, wherein said oscillator employs an electron discharge device having at least an anode, a cathode and a control grid, a frequency determining network for the oscillatory wave to be generated by said oscillator including a piezoelectric crystal connected between said anode and said control grid and a capacitor connected between said control grid and a point of reference potential, a source of constant direct-current voltage, a parallel inductor-capacitor network resonant at a frequency below the resonant frequency of said crystal and serially connected with a resistive element of approximately 2500 ohms between said anode and the positive terminal of said source, a resistor-capacitor grid bias network connected between said cathode and said point of reference potential, the resistor of said grid bias network having a resistance of approximately 680 ohms, a source of varying direct-current voltages, an approximately 33,000 ohm resistor connected between said control grid and one terminal of said varying voltage source, the other terminal of said varying voltage source being connected to said point of reference potential, and an inductor presenting a high impedance to oscillatory waves determined by said frequency determining network connected between said control grid and said varying voltage source.

References Cited in the file of this patent

UNITED STATES PATENTS

| | | |
|---|---|---|
| 2,067,082 | Goldstine | Jan. 5, 1937 |
| 2,458,760 | Andersen | Jan. 11, 1949 |
| 2,459,557 | Usselman | Jan. 18, 1949 |
| 2,625,650 | Spencer | Jan. 13, 1953 |

FOREIGN PATENTS

| | | |
|---|---|---|
| 625,791 | Great Britain | July 4, 1949 |